(12) United States Patent  
Gu et al.

(10) Patent No.: US 8,010,865 B2
(45) Date of Patent: Aug. 30, 2011

(54) SYSTEM AND METHOD FOR ENCODING AND DECODING IN WIRELESS COMMUNICATION SYSTEMS

(75) Inventors: Jian Gu, Beijing (CN); Hongkui Yang, San Diego, CA (US); Pengcheng Su, Beijing (CN)

(73) Assignee: Via Telecom, Inc., San Diego, CA (US)

( * ) Notice: Subject to any disclaimer, the term of this patent is extended or adjusted under 35 U.S.C. 154(b) by 849 days.

(21) Appl. No.: 12/019,601

(22) Filed: Jan. 24, 2008

(65) Prior Publication Data

US 2008/0184088 A1    Jul. 31, 2008

Related U.S. Application Data

(60) Provisional application No. 60/887,295, filed on Jan. 30, 2007.

(51) Int. Cl.
*H03M 13/00* (2006.01)
(52) U.S. Cl. .................................. 714/752; 375/265
(58) Field of Classification Search .................. 714/752; 375/265
See application file for complete search history.

(56) References Cited

FOREIGN PATENT DOCUMENTS

| CN | 1228212 | 9/1999 |
|----|---------|--------|
| CN | 1262825 | 8/2000 |

*Primary Examiner* — Esaw Abraham
(74) *Attorney, Agent, or Firm* — Baker & McKenzie LLP

(57) ABSTRACT

A control channel encoder that uses a channel structure that efficiently transmits more information bits, yet achieves sufficient detection and false alarm performance. Disclosed embodiments use a fixed encoder packet size, tail-biting convolutional coding, and Cyclical Redundancy Check (CRC). Further disclosed is a control channel decoder using Viterbi Decoding and a circular trellis check.

19 Claims, 14 Drawing Sheets

SYSTEM AND METHOD FOR ENCODING AND DECODING IN WIRELESS COMMUNICATION SYSTEMS

RELATED APPLICATIONS INFORMATION

This application claims priority under 35 U.S.C. 119(e) to U.S. Provisional Patent Application Ser. No. 60/887,295, entitled "CODING FOR F-SCCH, R-ODCCH IN LBC", filed Jan. 30, 2007, which is incorporated herein in its entirety as if set forth in full.

BACKGROUND

1. Field of the Invention

This application generally related to the field of wireless communication system, and more particularly to encode and decode control data bits in certain communication channel.

2. Related Arts

It will be understood that in a wireless communication system certain traffic channels are used to communicate data, e.g., between a base station or wireless access point and a wireless communication device. It will also be understood that certain information is required in order for a wireless communication device to accurately receive and decode the traffic channel. For example, in an Orthogonal Frequency Division Multiple Access (OFDMA) system, control channels are used, such as Forward Share Control Channel (F-SCCH) and Reverse OFDM Dedicated Control Channel (R-ODCCH), which convey information e.g., the Forward Share Control Channel (F-SCCH) is a signaling channel in the forward link which can carry access grants, assignment messages, and other messages related to resource management, and the Reverse OFDM Dedicated Control Channel (R-ODCCH) is a signaling channel in reverse link which can carry the reverse OFDMA Control channel messages such as resource requests and quality indicators.

The term "wireless communication device" as used in this description and the claims that follow is intended to refer to any device capable of wireless communication with, e.g., a base station or wireless access point. Thus, the term "wireless communication device" includes, but is not limited to, cellular telephone type devices, also known as handsets, mobiles, mobile handsets, mobile communication devices, etc., Personal Digital Assistants (PDAs) with wireless communication capability, smartphones, computing devices with wireless communication capability including handheld computers, laptops, or even desktop computers, etc.

It will also be understood that while many of the examples and embodiments provided herein refer to Wireless Wide Area Networks (WWANs), the systems and methods described herein can also be applied to Wireless Personal Area Networks (WPANs), Wireless Local Area Networks (WLANs), Wireless Metropolitan Area Networks (WMANs), etc. It will also be understood that such networks include some type of access device or infrastructure such as a base station, e.g., in a WWAN or WMAN, or an access point, e.g., in a WLAN. It will be understood therefore that reference to these access devices/infrastructures are interchangeable and that reference to one should not exclude reference to another unless explicitly stated or where such is dictated by the context of the reference.

SUMMARY

Systems and methods for implementing a control channel, e.g., in a UMB system, are presented below. Aspects of the channel structures used to implement the control channel described herein, can improve error detection capabilities, reduce decoding complexity, and increase transmission efficiency. In certain aspects, transmission efficiency can be increased through using fewer CRC bits and not transmitting tail bits. A circular trellis check and Viterbi decoding can also be used to increase efficiency and maintain error detection capabilities. Frame Error Rate (FER) can be reduced in embodiments described herein over that of tail-biting convolutional coding with an L-bit CRC. Furthermore, error detection offered by circular trellis check can well compensate the CRC check. Additionally, the encoder packet size can be fixed in order to facilitate decoding.

In one aspect, an encoder design is presented that embodies the above encoding techniques. Such an encoder design can be incorporated into an uplink or downlink transmitter design as required.

In another aspect, a decoder design is presented that embodies the above decoding techniques. Such a decoder design can be incorporated into an uplink or downlink transmitter designs as required.

In other aspects, methods for encoding a channel signal are presented that embody the various techniques described above and below.

In other aspects, methods for decoding a channel signal are presented that embody the various techniques described above and below.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION

In the following description and related figures, the same reference designations are used for similar components, operations, etc.

The embodiments described below provide for control channel encoding and decoding that can efficiently transmit information bits. Various embodiments described herein can use tail-biting convolutional coding, sequence repetition, interleaving, and cyclical redundancy check (CRC), coupled with modulation schemes such as BPSK, QPSK, 16QAM, or QAM. The embodiments described below are generally described in terms of QPSK; however, it will be understood that this does not exclude the use of other modulation techniques and is simply done for convenience. Furthermore, after tail-biting convolutional encoding and modulation, the modulated symbols can be further transformed according to the air interface standard being implemented, e.g., CDMA or OFDM, for transmission. For example, the signal can be transformed into an OFDM subcarrier waveform, e.g., with or without multiple antennas (Multiple In Multiple Out (MIMO)) or beam-forming.

Implementation of the embodiments described below can result in a frame structure with reduced overhead symbols, which can allow for increased capacity and a more efficient design. Furthermore, such a frame structure can allow lower transmission power or a lower signal to noise (Eb/N0) ratio as compared to conventional solutions.

The embodiments described herein can be used to implement various control channels in a, e.g., Ultra Mobile Broadband (UMB) system. Accordingly, the requirements for a particular channel should be taken into consideration when implementing the embodiments described herein. Furthermore, it will be understood that the encoder in FIG. 11 and the decoder described in FIG. 12, as with all embodiments described herein, can be implemented in software, hardware, or some combination thereof.

Figure 1:
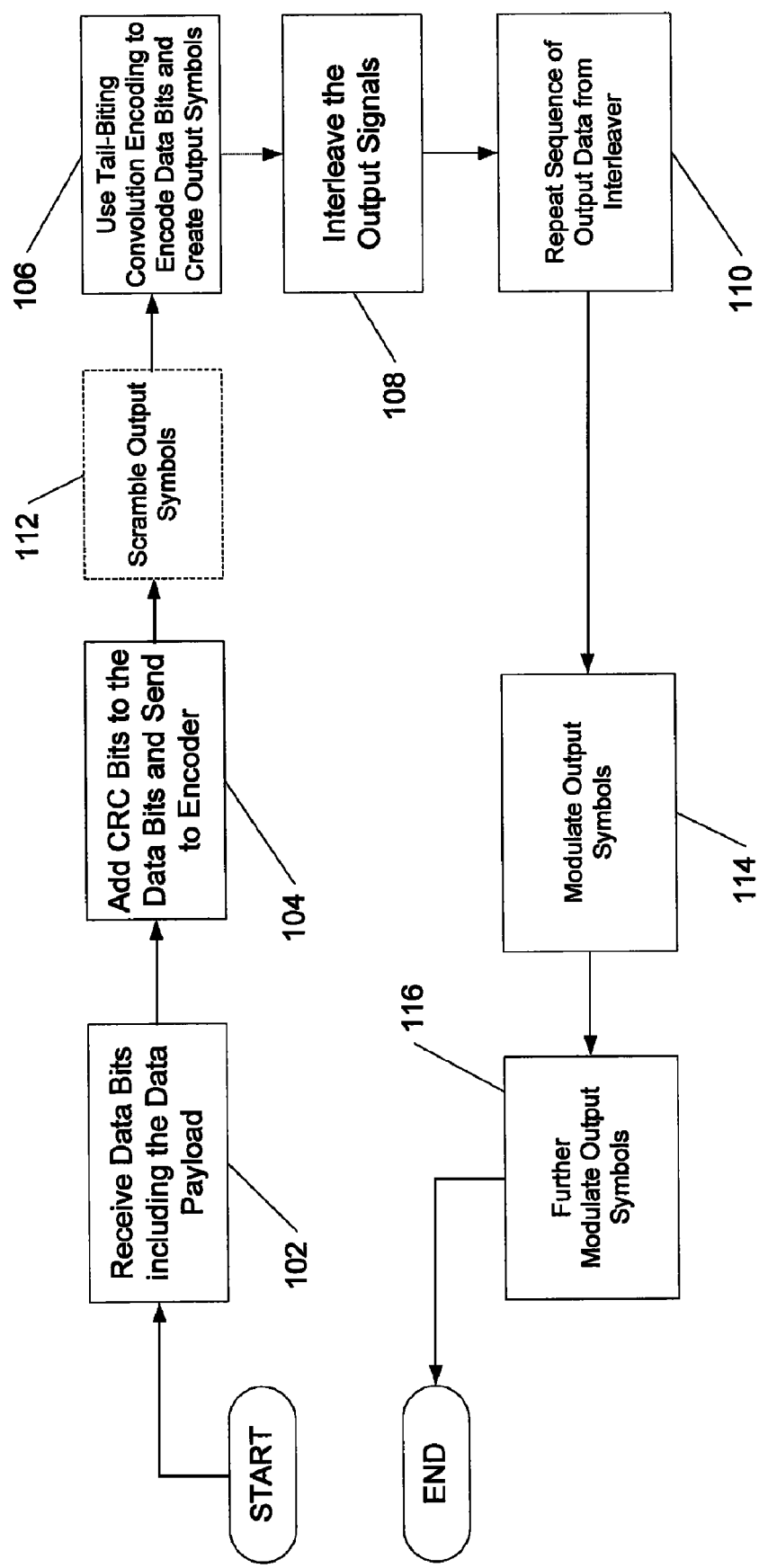
FIG. 1 is a diagram illustrating an example method in which a control channel encoder can be configured to encode the information bits for a control channel in accordance with one embodiment.

FIG. 1 is a diagram illustrating an example method in which a control channel encoder can be configured to encode the information data bits for a control channel in accordance with one embodiment. The method described in of FIG. 1 can be implemented on an encoder which can be included, for example, in a forward link or reverse link transmitter in a UMB system. For example, the encoding method can be implemented on an encoder to generate a control channels such as the Forward Share Control Channel (F-SCCH) and the Reverse OFDM Dedicated Control Channel (R-ODCCH) which convey information e.g., Forward Share Control Channel (F-SCCH) is a signaling channel in the forward link that can carry access grants, assignment messages, and other messages related to resource management, and Reverse OFDM Dedicated Control Channel (R-ODCCH) is a signaling channel in reverse link which can carry the reverse OFDMA Control channel messages such as resource requests and quality indicators. Thus, such an encoder can be used to encode the indication information, e.g. the resource management messages (in F-SCCH), which is often provided within an M-bit payload of up to 25-bits of information.

As can be seen, the encoding method 100 can comprise operation 102 in which data bits including the payload can be received, e.g., a 25-bit indictor. While a 25-bit payload is generally used in the examples that follow, it will be understood that the embodiments described herein are not necessarily limited to 25-bit payloads and that the number of bits will depend on the requirements of the particular implementation. In operation 104, CRC bits can be generated and added to the data bits from operation 102. Optionally, in certain embodiments, the encoding method can further comprise scrambling the output symbols from the operation of 104, in operation 112. In operation 106 a tail-biting convolutional encoding algorithm can be used to encode the data bits and create output symbols. In operation 108, the output symbols generated in operation 106 can be interleaved.

Interleaving is a way to arrange data in a non-contiguous way in order to increase performance. Interleaving is mainly used in digital data transmission technology to protect the transmission against burst errors. These errors overwrite a lot of bits in a row, but seldom occur. Interleaving is used to solve this problem. All data is transmitted with some control bits (independently from the interleaving), such as error correction bits that enable the channel decoder to correct a certain number of altered bits. If a burst error occurs, and more than this number of bits is altered, the codeword cannot be correctly decoded. So the bits of a number of codewords, or symbols are interleaved and then transmitted. This way, a burst error affects only a correctable number of bits in each codeword, so the decoder can decode the codewords correctly.

After the interleaving operation 108, the output symbols can be processed in operation 110 in which the output symbols can be sequence repeated. The sequence of bits at the output of the channel interleaver can be repeated sequence-by-sequence as many times as are necessary in the sequence repetition operation 110. The output symbols generated in operation 110 can then be forwarded for modulation in operation 114. In operation 114, the output symbols can be modulated, e.g. BPSK, QPSK, 16QAM, or QAM. The output symbols can be further modulated, e.g., for CDMA or OFDM transmission in operation 116.

Figure 2:
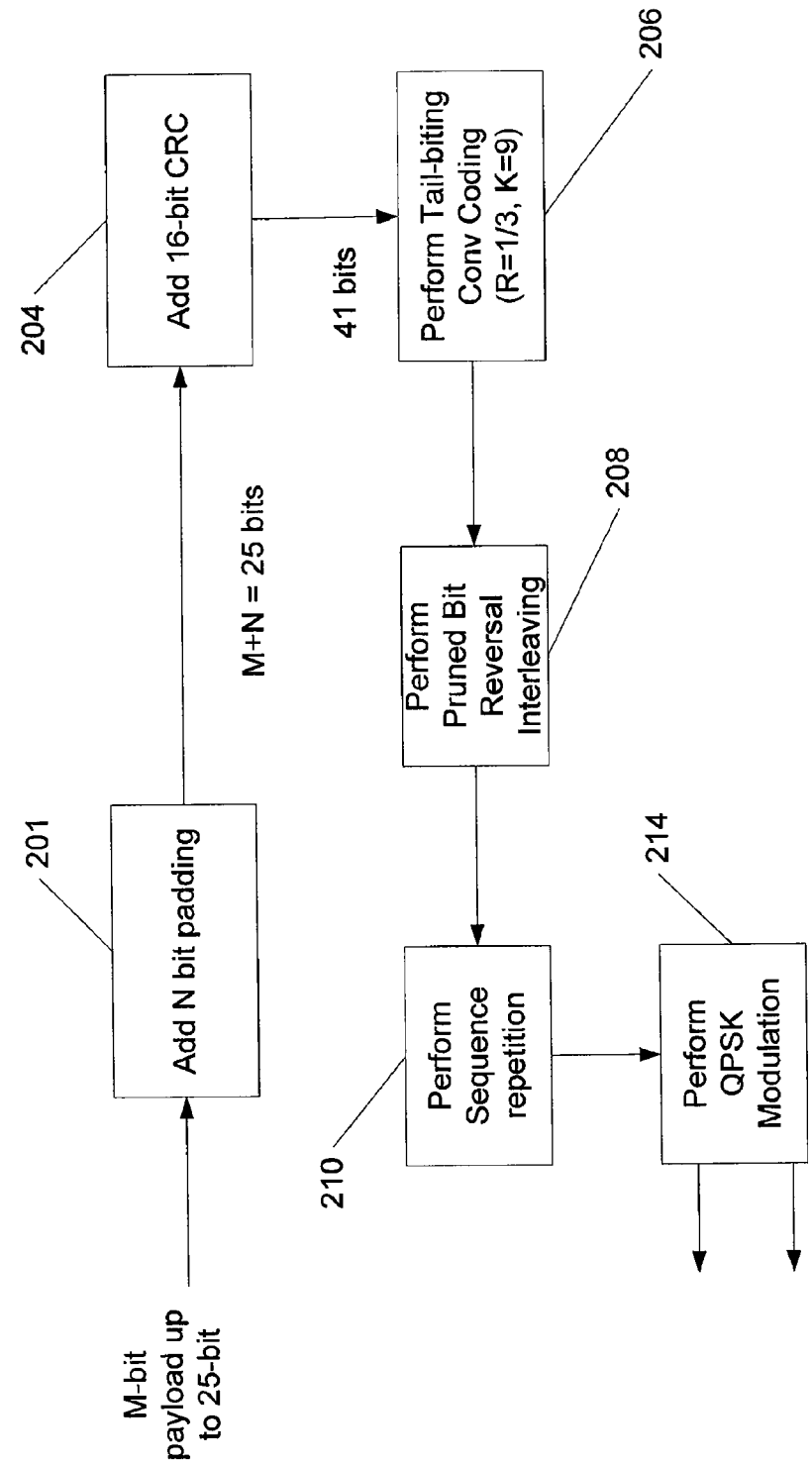
FIG. 2 is a diagram illustrating an example method in which a control channel encoder can be configured to encode the information bits for a control channel in accordance with another embodiment.

FIG. 2 is a diagram illustrating an example encoding method in which a control channel encoder, for instance an F-SCCH encoder, can be configured to encode the information bits for a control channel in accordance with another embodiment. Referring to FIG. 2, in the operation 201, an M-bit payload of up to 25-bits can be received and padded with N data bits, such that N+M is equal to 25 bits. In operation 204, these data bits can then be encoded by a CRC in operation 204, e.g. a 16-bit CRC. In operation 206, a tail-biting convolutional encoder can be used to encode the data bits into output symbols. In operation 208 the output symbols can then be interleaved, e.g. by a conventional pruned bit reversal interleaver. The sequence of bits at the output of the channel interleaver can then is repeated sequence-by-sequence as many times as are necessary in the sequence repetition operation 210. The output symbols can then be modulated in operation 214, e.g. using QPSK. Although not shown in FIG. 2, further modulation for transmission, e.g., via CDMA or OFDM, can then occur.

The CRC encoding in operation 204 can thus output 41 bits, which can then be subject to a tail biting convolutional encoding in operation 206. As will be understood, a convolutional encoder converts (k) input bits, in this case k=9, into a sequence of (n) bits. The n-bit sequence, or symbol, can then be used to determine the k bits in the receiver. Thus, the effective rate (R) of encoding (R=k/n) performed in block 206 is R=⅓. In certain embodiments, the convolutional encoding generator polynomials can be, e.g., 0557, 0663, and 0711 in octet.

Thus, it will be understood that when implementing the method of FIG. 2, tail bits are not required, as in a conventional system, to increase transmission efficiency. In the example of FIG. 2, the initial state for the tail-biting convolutional encoder should be the last K−1 bits of the packet being generated.

Figure 3:
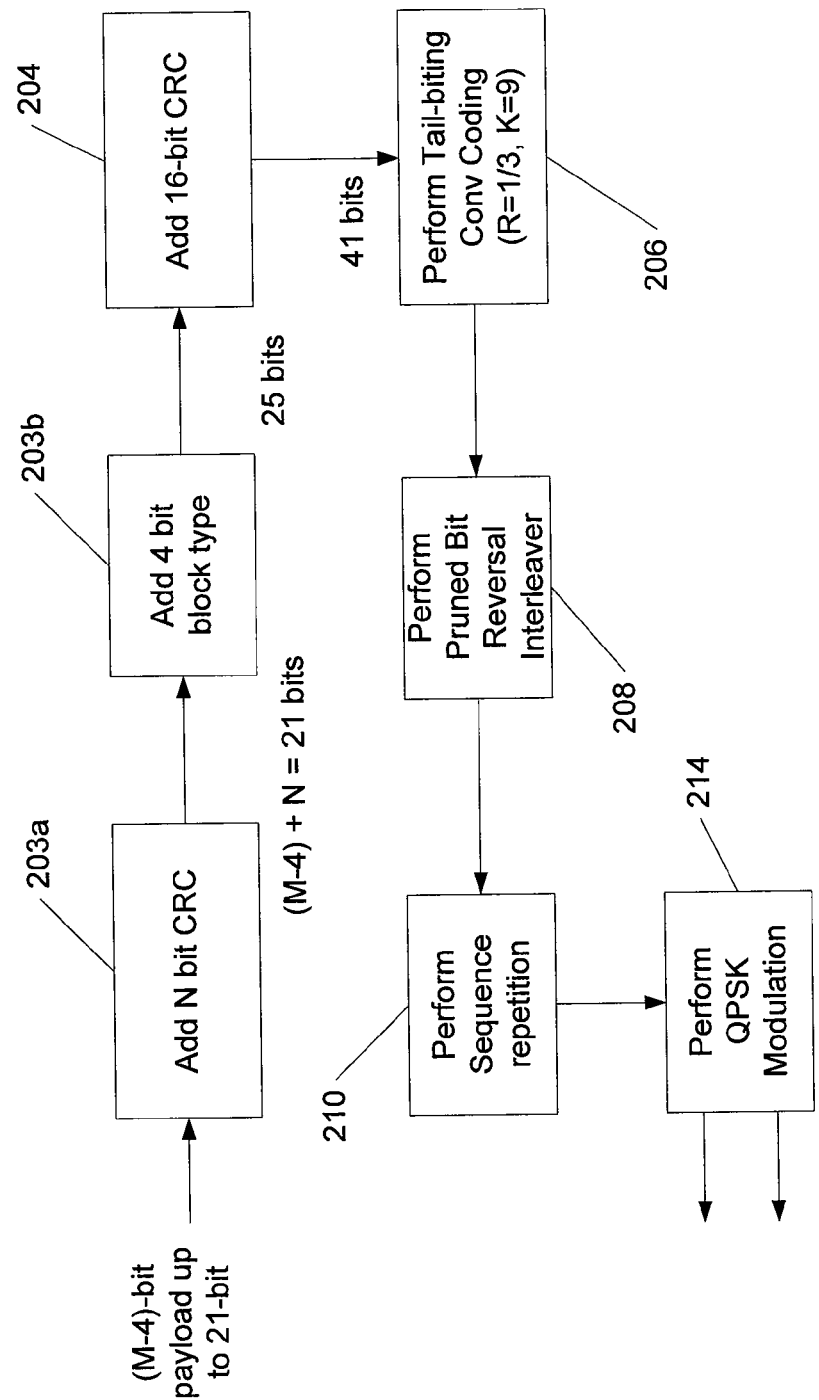
FIG. 3 is a diagram illustrating an example method in which a control channel encoder can be configured to encode the information bits for a control channel in accordance with still another embodiment.

FIG. 3 is a diagram illustrating an example encoding method in which a control channel encoder, for instance an F-SCCH encoder, can be configured to encode the information bits for a control channel in accordance with still another embodiment. Referring to FIG. 3, an N-bit CRC can be added to an M-bit payload of up to, e.g. 21-bits in operation 203a, such that N+M is equal to 21 bits. A 4-bit header block type can then be added to the data bits in operation 203b, such that the resulting output is e.g. 25 bits. In operation 204, the 25 bits of data can then be encoded by a CRC, e.g. a 16-bit CRC. In operation 206, a tail-biting convolutional encoder can be used to encode the data bits into output symbols. In operation 208 the output symbols can then be interleaved, e.g. by a conventional pruned bit reversal interleaver. The sequence of bits can then be repeated sequence-by-sequence as many times as are necessary in the sequence repetition operation 210. The output symbols can then be modulated in block 214, e.g., using QPSK. Although not shown in FIG. 3, further modulation for transmission, e.g., via CDMA or OFDM, can then occur.

Thus the method of FIG. 3 can provide increased error detection capability relative to the embodiment of FIG. 2. In general, the number of CRC bits for the embodiments of FIGS. 2 and 3 can be reduced, e.g. to 15 bits or 16 bits. Moreover, error detection capability can be guaranteed by the tail-biting convolutional coding and the CRC, e.g. 16-bit CRC. The CRC in UMB is based on a truncated 24-bit CRC whose generator polynomial.

The generator polynomial for the 24-bit CRC shall be as follows:

$$g(x)=x24+x23+x18+x17+x14+x11+x10+x7+x6+x5+x4+x3+x+1.$$

When the CRC length is less than 24, 24 CRC bits shall be computed as described above. However, only the first N-bits of the CRC shall be transmitted and the remaining bits shall be discarded.

For the embodiment of FIG. 3, the number of extra CRC bits N can be from 0 to 9. The corresponding polynomials can be computed as described above, The size of the payload should depend on the block type. Further the encoder packet size can be fixed to facilitate decoding and as mentioned above, scrambling can also be used.

Figure 4:
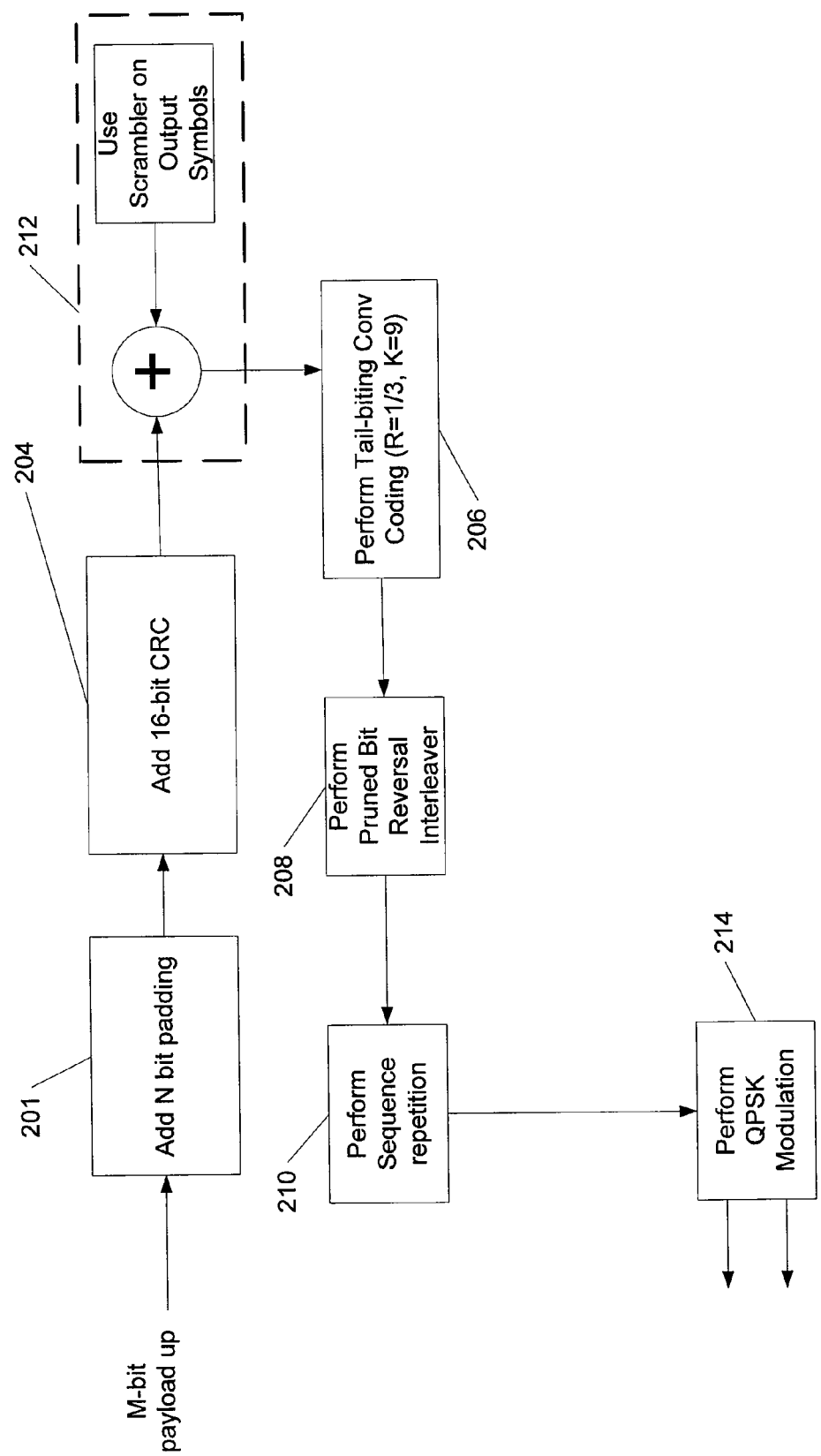
FIG. 4 is a diagram illustrating an example method in which a control channel encoder can be configured to encode the information bits for a control channel in accordance with still another embodiment.

FIG. 4 is a diagram illustrating an example encoding method in which a control channel encoder, for instance an R-ODCCH encoder, can be configured to encode the information bits for a control channel in accordance with still another embodiment. Referring to FIG. 4, an M-bit payload of up to, e.g., 25-bits can be padded with N bits, such that N+M is equal to 25 bits, in operation 201. These data bits can then be encoded by a CRC encoder in operation 204, e.g. a 16-bit CRC encoder. After the bits are CRC encoded, the symbols can then be scrambled in operation 212, using a scrambling algorithm. In operation 206, a tail-biting convolutional encoder can be used to encode the data bits into output symbols. In operation 208, the output symbols can then be interleaved, e.g. by a conventional pruned bit reversal interleaver. The sequence of bits can then be repeated sequence-by-sequence as many times as is necessary in the sequence repetition operation 210. After the bits are repeated, the data can then be modulated in operation 214, e.g. using QPSK. Although not shown in FIG. 4, further modulation for transmission, e.g., via CDMA or OFDM, can then occur.

Figure 5:
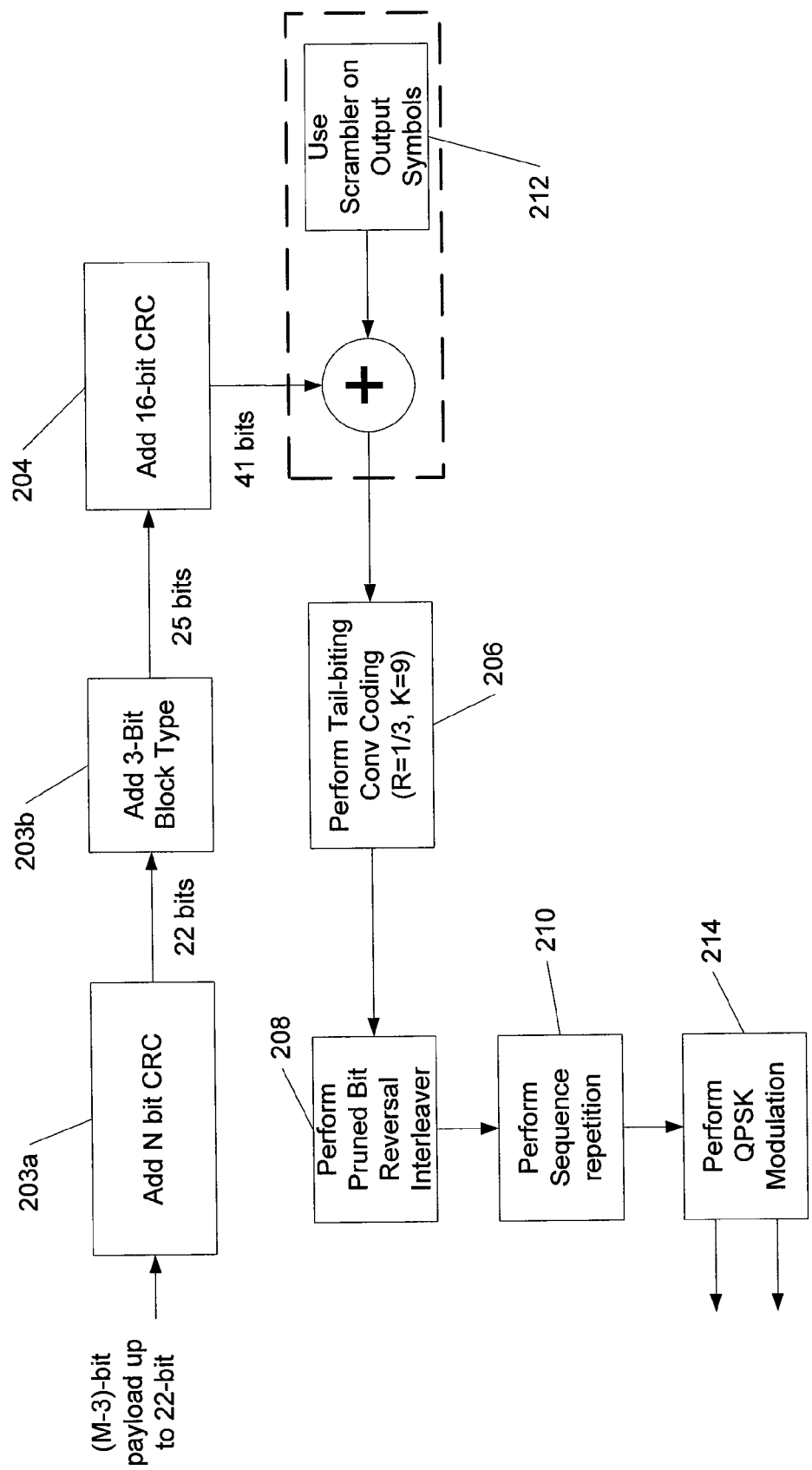
FIG. 5 is a diagram illustrating an example method in which a control channel encoder can be configured to encode the information bits for a control channel in accordance with still another embodiment.

FIG. 5 is a diagram illustrating an example encoding method in which a control channel encoder, for instance an R-ODCCH encoder, can be configured to encode the information bits for a control channel in accordance with still another embodiment. Referring to FIG. 5, an N-bit CRC can be added to an M-bit payload of up to, e.g., 22-bits in operation 203a, such that N+M is equal to 22 bits. A 3-bit header block type can then be added in operation 203b. The e.g., 25 bits of data can then be encoded in operation 204, e.g., using a 16-bit CRC. The symbols may then be scrambled in operation 212, using a scrambling algorithm. In operation 206, a tail-biting convolutional encoder can be used to encode the data bits into output symbols. In operation 208, the output symbols can then be interleaved, e.g., by using a pruned bit reversal interleaver. The sequence of bits can then be repeated sequence-by-sequence as many times as is necessary in the sequence repetition captured in operation 210. The output symbols can then be modulated in operation 214, e.g., using QPSK. Although not shown in FIG. 5, further modulation for transmission, e.g., via CDMA or OFDM, can then occur.

With respect to the embodiments of FIGS. 4 and 5, the size of the payload can depend on the header. Further, the packet size can be fixed to facilitate decoding. The tail-biting generating polynomials can be, e.g. 0557, 0664, and 0711, in octet. Detection error capability can be guaranteed due to the tail-biting convolutional decoding and, e.g. a 15-bit or 16-bit CRC. The CRC polynomial can be the same as above. Further, the polynomial for the additional, e.g. up to a 5-bit CRC of the embodiment of FIG. 5 can be the same as shown above.

Figure 6:
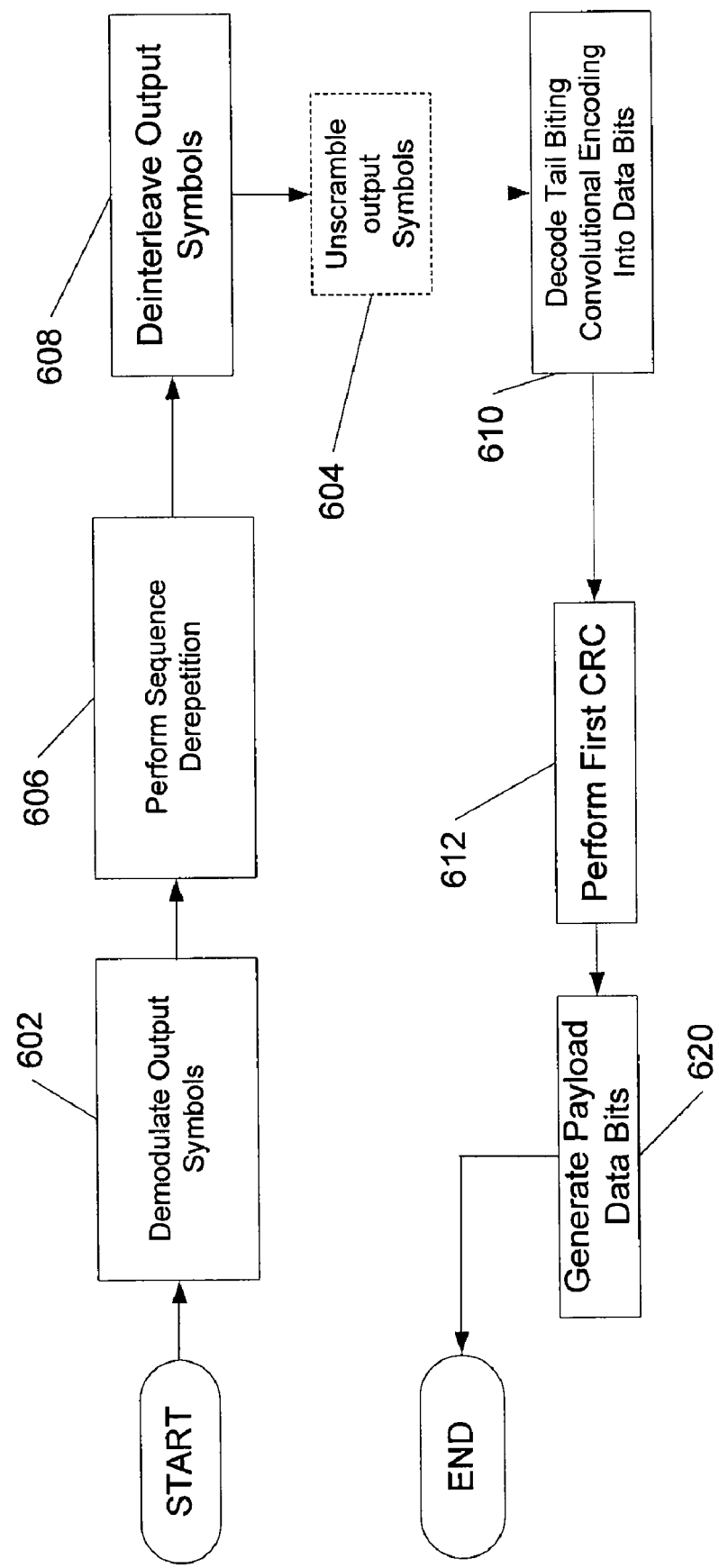
FIG. 6 is a diagram illustrating an example method in which a control channel decoder can be configured to decode the information bits for a control channel in accordance with one embodiment.

FIG. 6 is a diagram illustrating an example decoding method in which a control channel decoder can be configured to decode the information bits for a control channel, such as in F-SCCH or R-ODCCH, in accordance with one embodiment. Referring to FIG. 6, the data bits or symbols can first be demodulated in operation 602, e.g. using QPSK. The output symbols from operation 602 can then have the repeated sequences removed in operation 606. The output can then be deinterleaved in operation 608. For instance, a pruned bit reversal deinterleaver algorithm can be used to deinterleave the symbols in operation 608. Optionally, if the symbols are scrambled, the symbols can then be unscrambled in operation 604. Next, in operation 610, the symbols can have the tail biting convolutional encoding decoded. In one embodiment, this tail-biting convolutional decoding can be performed by Viterbi Decoding and a Circular Trellis Check.

As described below, the trellis of a tail-biting convolutional code is circular. Thus the decoding can be detected as failure or success through checking whether the trellis of survival path in Veterbi decoder is circular. Thus a circular trellis check can improve error detection capability, and hence can reduce the number of regular CRC bits by 1.

The resulting data bits can then be CRC decoded. In operation 620, the payload data bits can then be generated. Various embodiments are described in more detail below.

Figure 7:
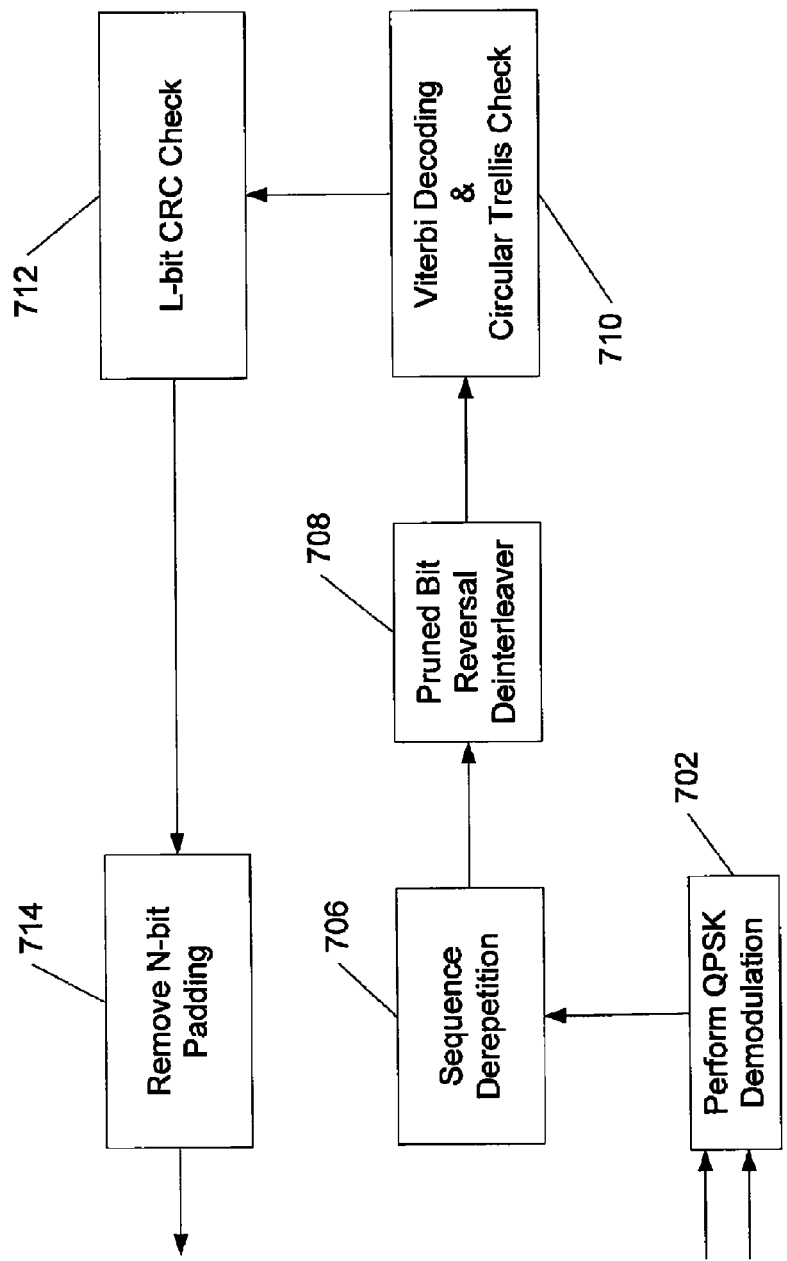
FIG. 7 is a diagram illustrating an example method in which a control channel decoder can be configured to decode the information bits for a control channel in accordance with another embodiment.

FIG. 7 is a diagram illustrating an example decoding method in which a control channel decoder can be configured to decode the information bits for a control channel such as in F-SCCH or R-ODCCH, in accordance with another embodiment. The data bits or symbols can first be demodulated in operation 702, e.g. using QPSK. The symbols can then have the repeated sequences removed in operation 706. After the repeated symbols are removed in operation 706, the remaining symbols can be deinterleaved in operation 708. For instance, a pruned bit reversal deinterleaver algorithm can be used to deinterleave the symbols in operation 708. Next, the symbols can have the tail biting convolutional encoding decoded in step 710. In one embodiment, this tail-biting convolutional decoding can be performed using Viterbi Decoding and a Circular Trellis Check. For example, in one embodiment, the Viterbi decoding frame length can be extended to the encoder packet size plus a(k−1), where a is between 3 and approximately 5. All initial states in such a Viterbi decoder can be initialized to the same probability. This should provide a decoding performance that is almost as good as a Viterbi decoder with known initial states, but with less complexity. The resulting data bits can then be CRC decoded in operation 712.

The data bits can then be stripped of the N-bit padding in operation 714 to produce the payload data bits.

Figure 8:
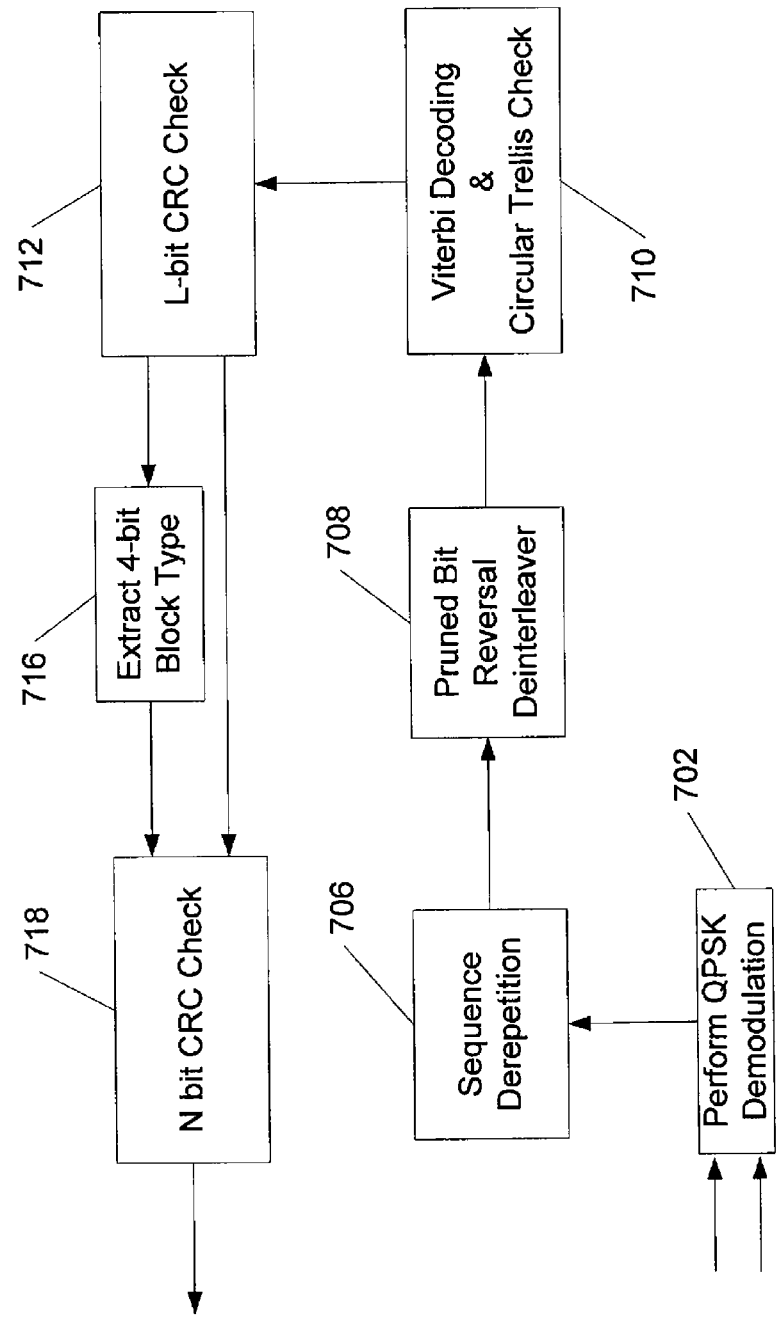
FIG. 8 is a diagram illustrating an example method in which a control channel decoder can be configured to decode the information bits for a control channel in accordance with still another embodiment.

FIG. 8 is a diagram illustrating an example decoding method in which a control channel decoder can be configured to decode the information bits for a control channel, e.g. an F-SCCH, in accordance with still another second embodiment. The data bits or symbols can first be modulated 702, e.g. QPSK. The symbols can then have the repeated sequences removed in operation 706. After the repeated symbols are removed in operation 706, the remaining symbols can be deinterleaved in operation 708. For instance, a pruned bit reversal deinterleaver algorithm can be used to deinterleave the symbols in operation 708. Next, in operation 710, in which the symbols can have the tail biting convolutional encoding decoded. In one embodiment, this tail-biting convolutional decoding can be performed using Viterbi Decoding, e.g. as described above, and a Circular Trellis Check. The method can then proceed to operation 712, in which the resulting data bits can then be CRC decoded. After the CRC decoder in operation 712, the block header type, e.g., 4-bit block header type, can be extracted from the data bits 716. The data bits can then be checked using a second CRC algorithm, the form of which can be dependent on the block type extracted in operation 716, in operation 718. Operation 718 can decode the information bits and produce the payload.

Figure 9:
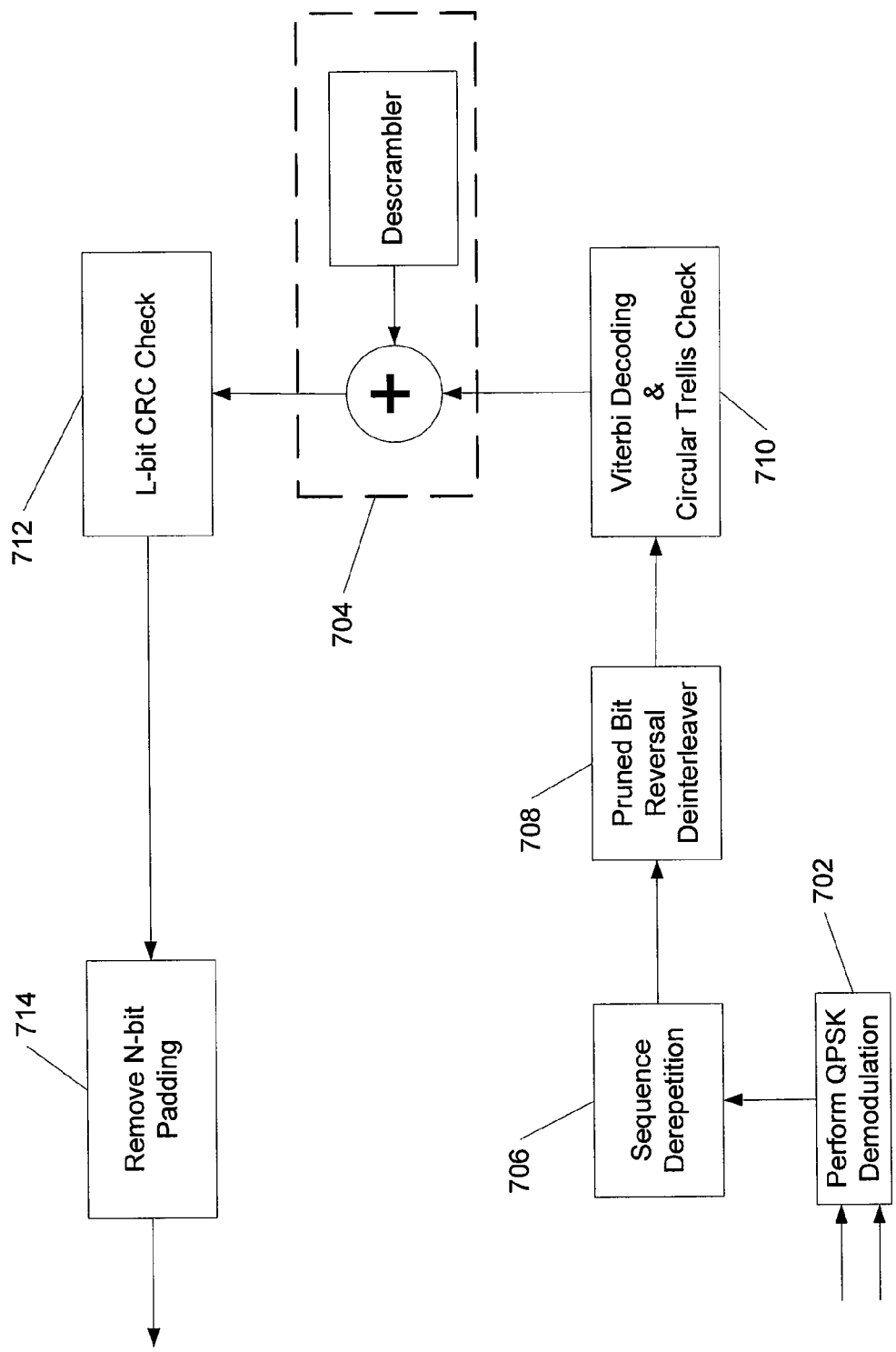
FIG. 9 is a diagram illustrating an example method in which a control channel decoder can be configured to decode the information bits for a control channel in accordance with still another embodiment.

FIG. 9 is a diagram illustrating an example decoding method in which a control channel decoder can be configured to decode the information bits for a control channel, e.g. an R-ODCCH, in accordance with another embodiment. The data bits or symbols can first be demodulated in operation 702, e.g. using QPSK. After demodulation in operation 702, the symbols can then have the repeated sequences removed in operation 706. After operation 706, the remaining symbols can be deinterleaved in block 708. For instance, a pruned bit reversal deinterleaver algorithm can be used to deinterleave the symbols in operation 708. Next, in operation 710, the symbols can have the tail biting convolutional encoding decoded. In one embodiment, this tail-biting convolutional decoding can be performed using Viterbi Decoding and a Circular Trellis Check. Optionally, if the output symbols are scrambled, the output symbols can then be processed through the descrambler and the output symbols can be unscrambled in operation 704. The resulting data bits of operation 710 or operation 704 can then be CRC decoded in operation 712. In operation 714, the data bits can be stripped of any N-bit padding.

Figure 10:
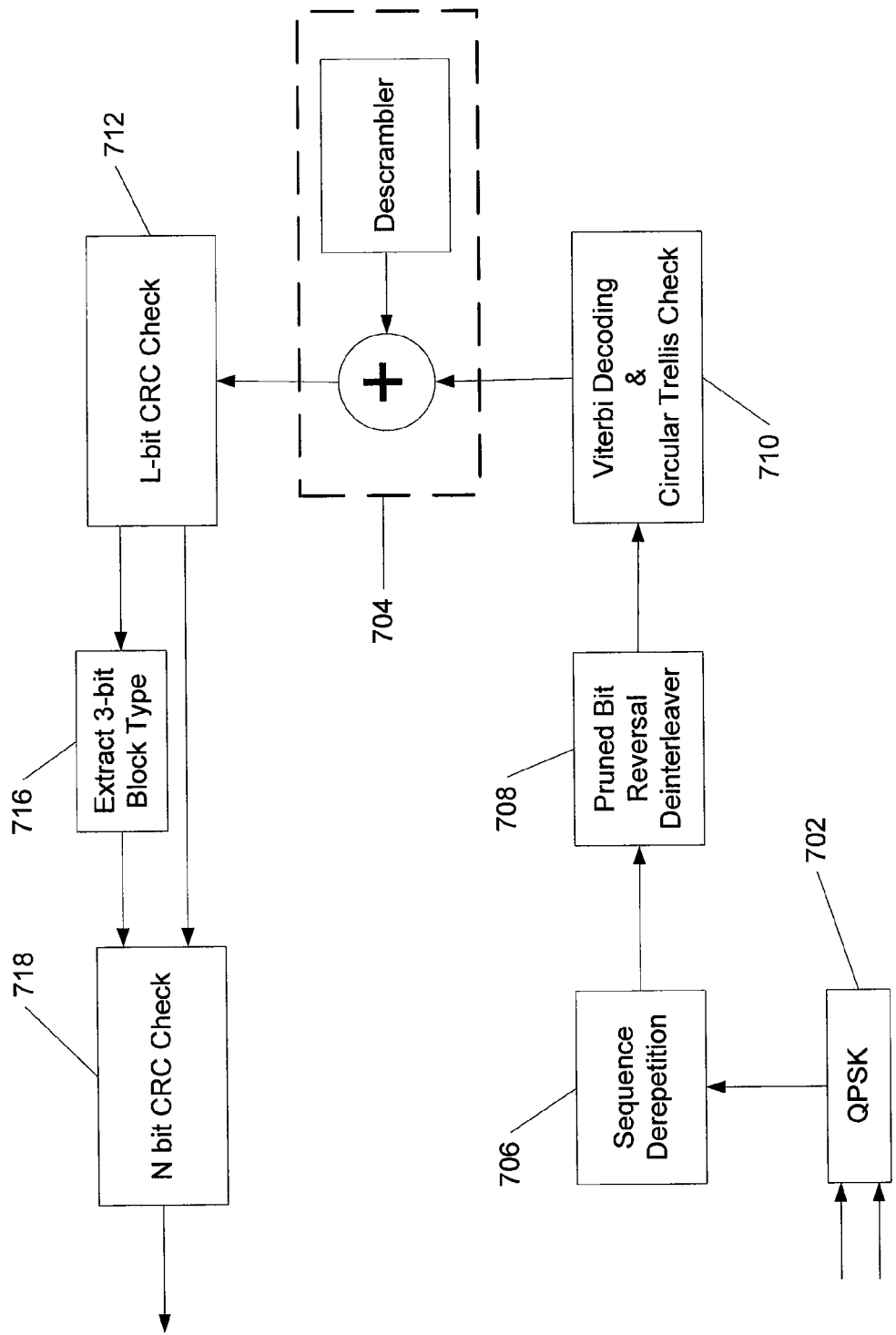
FIG. 10 is a diagram illustrating an example method in which a control channel decoder can be configured to decode the information bits for a control channel in accordance with still another embodiment.

FIG. 10 is a diagram illustrating an example decoding method in which a control channel, e.g., an R-ODCCH, decoder can be configured to decode the information bits for a control channel in accordance with a second embodiment. The data bits or symbols can first be demodulated in operation 702, e.g., using QPSK. After demodulation in operation 702, the repeated sequences can then be removed in operation 706. After the repeated symbols are removed in operation 706, the remaining symbols can be deinterleaved in operation 708. For instance, a pruned bit reversal deinterleaver algorithm can be used to deinterleave the symbols in operation 708. Next, in operation 710, the symbols can have the tail biting convolutional encoding decoded. In one embodiment, this tail-biting convolutional decoding can be performed using Viterbi Decoding and a Circular Trellis Check. Optionally, if the output symbols are scrambled, the output symbols can then be processed through the descrambler and the output symbols can be unscrambled in operation 704. The resulting data bits of operation 710 or operation 704 can then be CRC decoded in operation 712. After the CRC check in block 712, the block header type, e.g. 3-bit block header type, can be extracted from the data bits 716. The data bits can then be decoded using a second CRC algorithm in operation 718 and the payload information bits can be generated. The CRC algorithm used in operation 718 can depend on the 3-bit header type extracted in operation 716.

Figure 11:
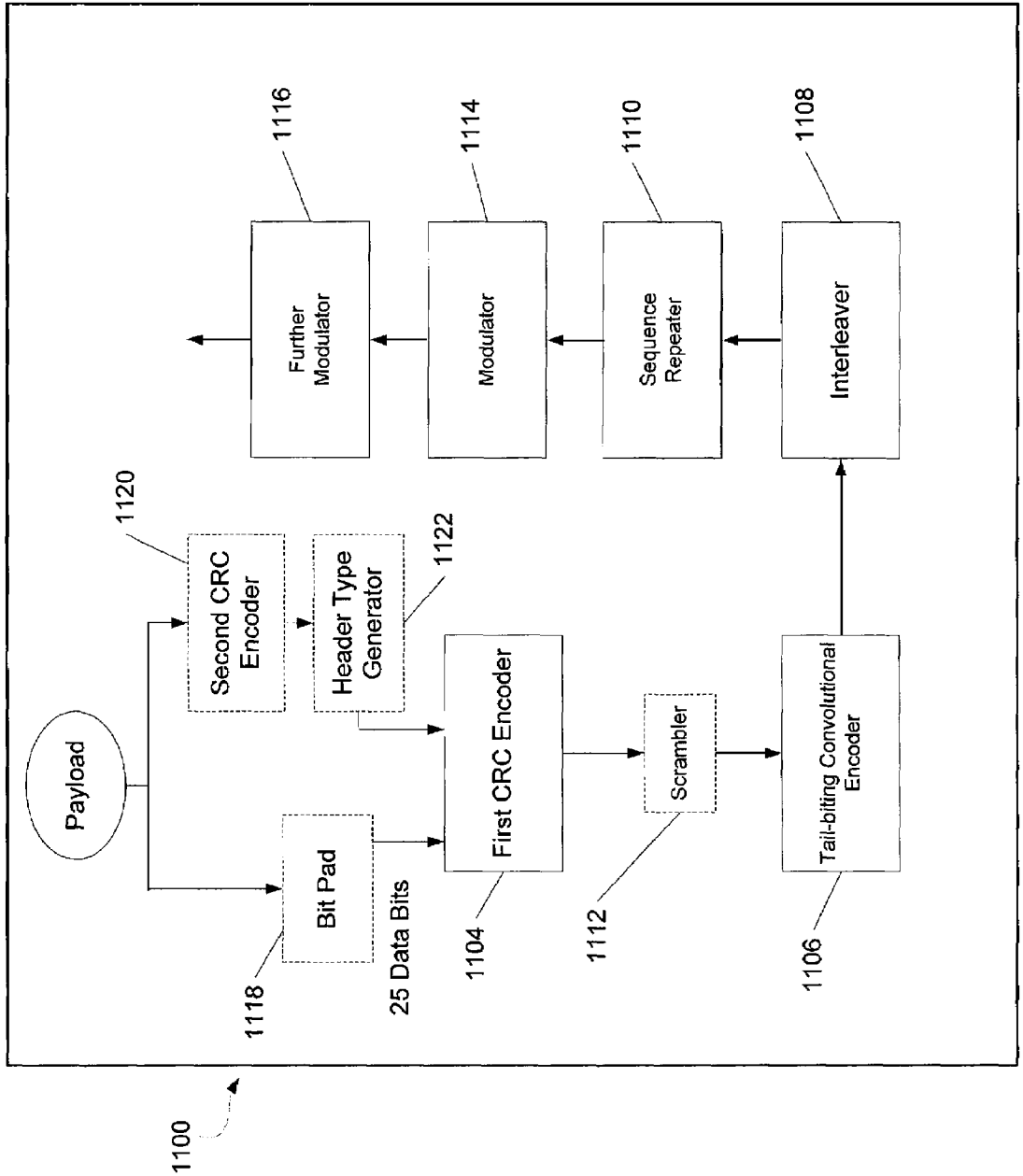
FIG. 11 is a diagram illustrating an example in which a control channel encoder can decode the information bits for a control channel in accordance with one embodiment.

FIG. 11 is a diagram illustrating an example a control channel encoder 1100 that can be configured to encode information bits for a control channel in accordance with one embodiment. The encoder 1100 can be included, for example, in a forward link, or reverse link transmitter in a UMB system. For example, the encoder 1100 can be implemented to generate control channels such as an F-SCCH and an R-ODCCH.

As can be seen, the encoder 1100 can comprise a CRC encoder 1104 which can receive data bits, e.g., 25 data bits, generate a CRC data, e.g. a 15-bit or 16-bit CRC, and add the CRC bits to the data bits. Optionally, the encoder can also include a scrambler 1112 coupled to the first CRC encoder 1104. Encoder 1100 can also include a tail-biting convolutional encoder 1106 coupled with either the CRC encoder 1104 or the option scrambler 1112, which can be configured to encode the data bits and create output symbols. An interleaver 1108 can be coupled with a tail-biting convolutional encoder 1106, and can be configured to interleave the output symbols. A sequence repeater 1110 can be coupled with the interleaver 1108 and can be configured to take sequence of bits at the output of the channel interleaver and repeat the data sequence-by-sequence as many times as is necessary. A modulator 1114, e.g. a QPSK, QAM, or BPSK modulator, can be coupled with the sequence repeater 1110 and can be configured to modulate the output of the repeater. Additionally, a second modulator 1116 can be coupled to the first modulator 1114 and can be configured to transform the output according to the air interface standard being implemented, e.g., CDMA or OFDM, for transmission.

Additionally, in one embodiment, when the payload is less than e.g., 25 bits, the encoder can further comprise a bit padder 1118 coupled to the input of the first CRC encoder 1104, and can be configured to add padding bits such that the total number of bits passed to first CRC encoder is e.g., 25 bits.

Additionally, in certain embodiments, when the payload is less than, e.g., 25 bits, the encoder can further comprise a second CRC encoder 1120 coupled to a block type generator 1122 which can be coupled to the input of the first CRC block encoder 1104, wherein the second CRC encoder can be configured to generate an N-bit CRC in which N is equal 25 bits minus the sum of the header bits and the payload bits. This ensures that 25 total bits can be passed to the first CRC encoder 1120. The block type generator 1122 can be configured to generate an n-bit block type and add the block type to the bits being input to the first CRC encoder 1104.

Figure 12:
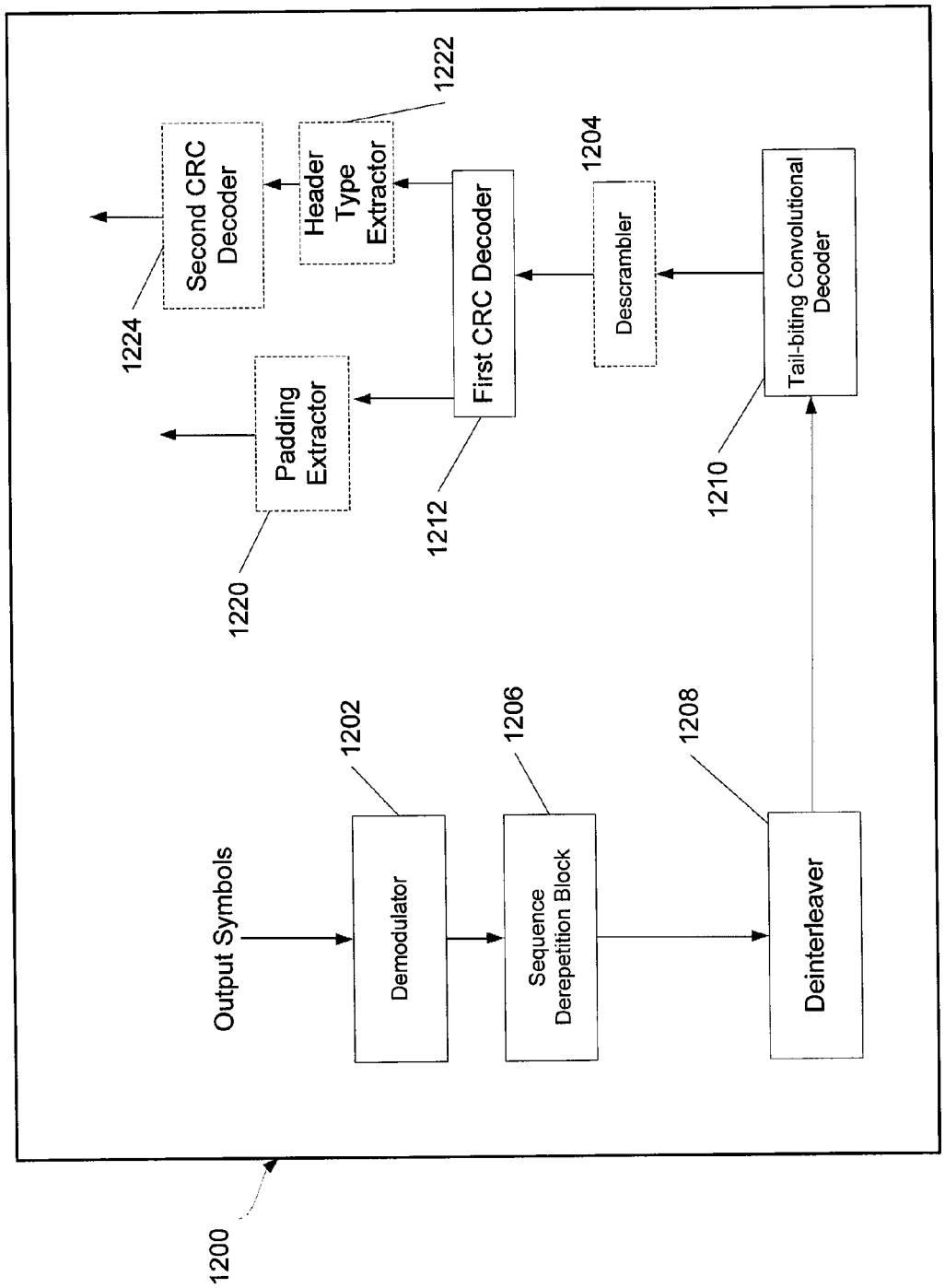
FIG. 12 is a diagram illustrating an example in which a control channel decoder can decode the information bits for a control channel in accordance with one embodiment.

FIG. 12 is a diagram illustrating an example control channel decoder 1200 configured to decode the information bits for a control channel in accordance with one embodiment. The decoder 1200 can be included, for example, in a forward link, or reverse link transmitter in a UMB system. For example, the encoder 1200 can be implemented on control channels such as an F-SCCH or an R-ODCCH.

As can be seen, the encoder 1200 can comprise a demodulator, e.g. a QPSK, QAM, or BPSK demodulator, a sequence extractor 1206 (herein also referred to as a sequence derepetition block) which can be configured to extract the repeated sequences, a deinterleaver 1208 coupled to the sequence extractor 1206, a tail-biting convolutional decoder 1210 coupled to the deinterleaver 1208, and a first CRC decoder 1212 coupled to the tail-biting convolutional decoder 1210. Optionally, the decoder 1200 can include a descrambler 1204 coupled between the tail-biting convolutional decoder 1210 and the first CRC decoder 1212, which can be configured to unscramble the output signal from the demodulator 1202 before sending the output signal to the first CRC decoder 1212.

Additionally, certain embodiments described herein may also include a padding extractor 1220 coupled to the output of the first CRC decoder 1212, which can be configured to extract any padding bits that may have been added to the payload data bits. Alternatively, certain embodiments can also include a header type extractor 1222 coupled to the first CRC decoder 1212 and to a second CRC decoder 1224. The second CRC decoder 1224 can be dependant on the header which can be extracted by the heading type extractor 1222, which can be of varying length, e.g. 3-bit in R-ODCCH, and 4-bit in F-SCCH. The header extractor 1222 can be configured to remove the header type from the output data of the first CRC decoder 1212. The second CRC decoder 1224 can receive the output of either the header extractor 1222 or the first CRC decoder 1212 and decode a second CRC in the data bits. The second CRC decoder 1224 can then output the payload.

According to certain embodiments, a pruned bit reversal deinterleaver algorithm can be used by the deinterleaver 1208. Further, according to certain embodiments herein, the tail-biting convolutional decoder can comprise a Veterbi Decoder and a Circular Trellis check, as described above.

Figure 13:
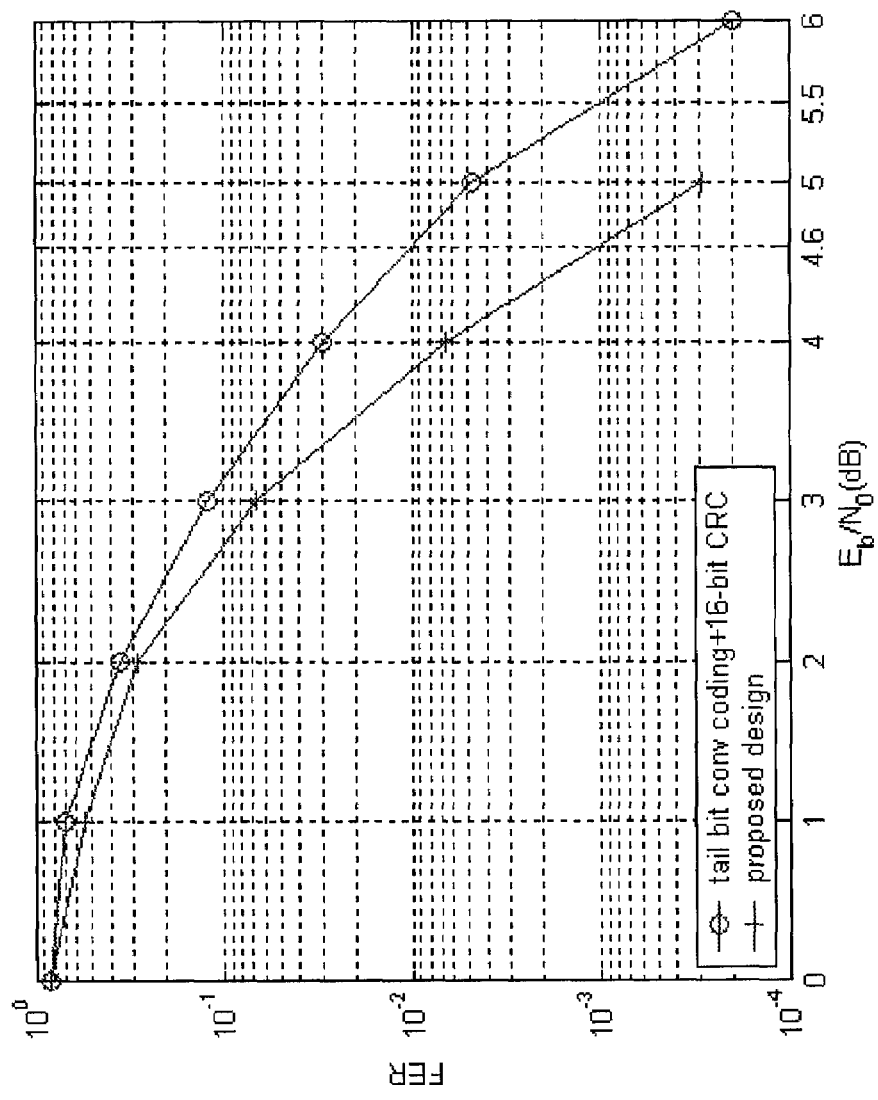
FIG. 13 is a plot diagram showing a simulation result detailing the Frame Error Rate (FER) against the signal to noise ratio $E_b/N_0$ (dB) for the embodiments of FIGS. 2, 3, 7, and 8, relative to that of a conventional tail-biting convolutional coding algorithm with a 16-bit CRC.

FIG. 13 is a plot diagram showing a simulation result detailing the Frame Error Rate (FER) against the signal to noise ratio $E_b/N_0$ (dB) for the embodiments described in FIGS. 2, 3, 7 and 8, where M=25, relative to that of a conventional tail-biting convolutional coding algorithm and a 16-bit CRC. As seen in the simulation results in FIG. 13, the Frame Error Rate (FER) is reduced relative to that of tail-biting convolutional coding with a 16-bit CRC. The simulation results shown in FIG. 13 displays a gain over conventional coding of approximately 0.9 dB at FER=0.1%. In the example of FIG. 13, a=5 for the tail-biting Viterbi decoding.

Figure 14:
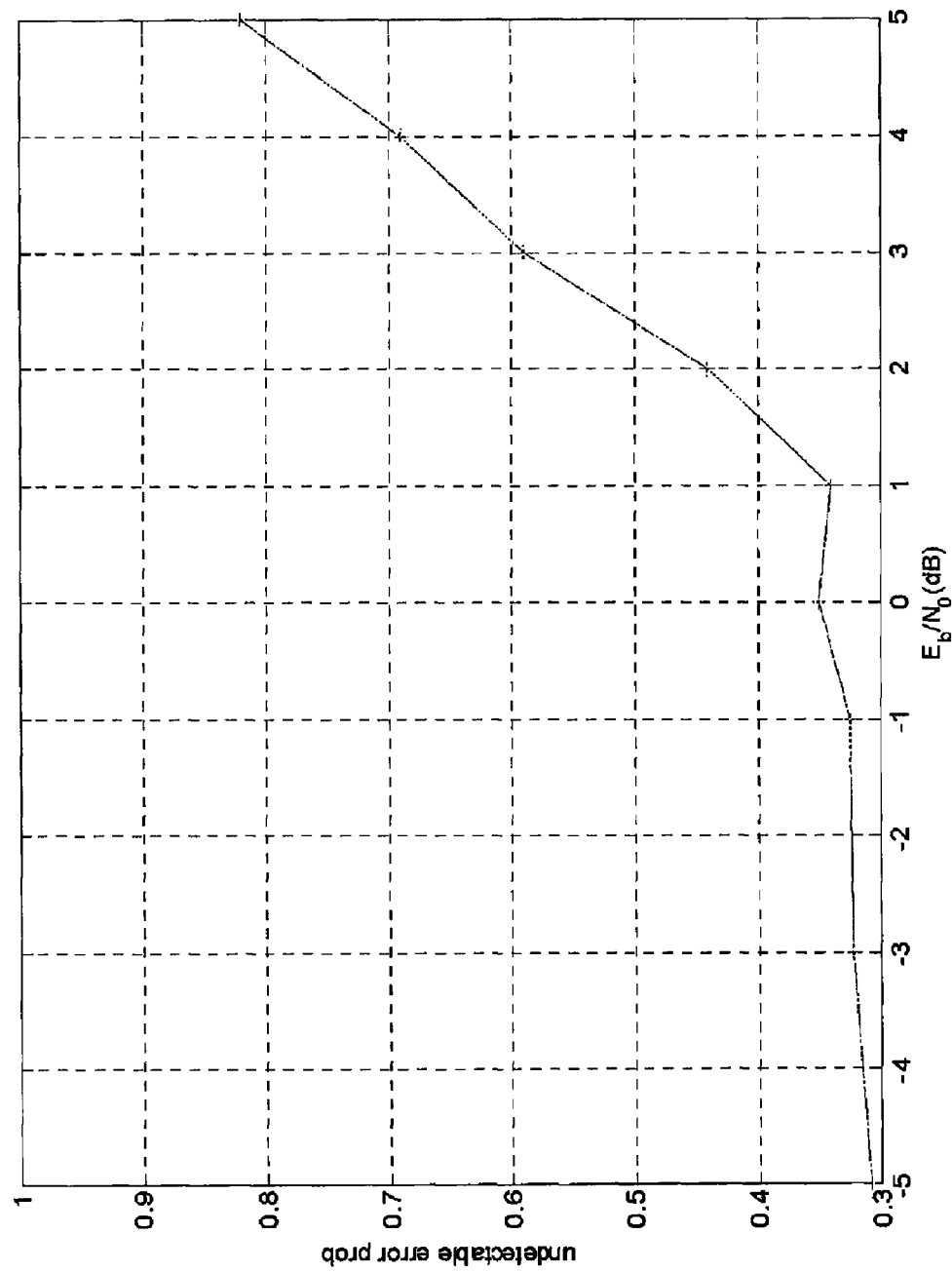
FIG. 14 is a graph of the undetectable error probability against the signal to noise ratio $E_b/N_0$ (dB) for the embodiments of FIGS. 2, 3, 7, and 8.

FIG. 14 is a graph of the undetectable error probability against the signal to noise ratio (SNR), measured as $E_b/N_0$ (dB), for the embodiment described in FIGS. 2, 3, 7, and 8. FIG. 14 shows that the error detection offered by circular trellis check satisfactorily compensates the CRC check. The undetected error rate of a L-bit CRC is around $2^{-L}$ at low SNR, or high Bit Error Rate (BER). The undetected error rate of a L-bit CRC is much lower than $2^{-L}$ at high SNR (low BER); therefore, high undetected error probability of circular trellis check at a high SNR doesn't negatively affect the overall performance.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A channel encoder configured to encode M data bits onto a channel for further modulation, comprising:
   a first cyclical redundancy check (CRC) encoding block configured to receive the M data bits, generate L CRC bits, and add the L CRC bits to the M data bits;
   a padding block coupled to the first cyclical redundancy check (CRC) encoding block, wherein the padding block is configured to receive the M data bits, add n bits of padding to the M data bits, and output M+n bits of data to the first CRC encoding block;
   a tail-biting convolutional encoder coupled to the first CRC encoding block, the tail-biting convolutional encoder configured to encode the M+L bits using a tail biting technique and generate output symbols;
   an interleaver coupled to the tail-biting convolutional encoder, the interleaving block configured to interleave the output symbols; and
   a sequence repetition block coupled to the interleaver, the sequence repetition block configured to add a repetition sequence to the output symbols.

2. The channel encoder of claim 1, wherein the interleaver block is a pruned bit reversal interleaver block.

3. The channel encoder of claim 1, wherein the channel encoder further comprises:
   a second cyclical redundancy check (CRC) encoding block, wherein the second CRC encoding block is configured to receive the M data bits and add n CRC bits to the M data bits; and
   a header type block coupled to the second CRC encoding block and the first CRC encoding block, wherein the header type block is configured to receive the M+n data bits, add a header type to the data bits, and output to the first CRC encoding block.

4. The channel encoder of claim 1, further comprising a scrambler block coupled to the first cyclical redundancy check (CRC) encoding block and the tail-biting convolutional encoder, the scrambler block configured to scramble the output symbols from the sequence repetition block and send the scrambled output symbols to the tail-biting convolutional encoder.

5. The channel encoder of claim 1, wherein the data bits are Forward Share Control Channel (F-SCCH) bits or Reverse OFDM Dedicated Control Channel (R-ODCCH) bits.

6. A method for encoding information bits onto a control channel for further modulating, comprising:
  generating L-CRC bits of received payload data bits;
  adding the L-CRC bits to the payload data bits;
  generating a second N-bit CRC;
  generating an n-bit header type;
  adding the N-bit CRC to the payload, wherein N is equal to M minus the total number of bits in the payload and a header type;
  generating output symbols from the L-CRC and payload data bits using a tail biting technique;
  interleaving the output symbols; and
  repetition sequencing the output symbols.

7. The method of claim 6, further comprising adding N bits of padding to the payload data bits before generating the first CRC bits.

8. The method of claim 6, further comprising scrambling the output symbols after adding the L-CRC bits to the payload data bits and before generating the output symbols from the L-CRC and payload data bits using the tail biting technique.

9. The method of claim 6, wherein interleaving the output symbols comprises a pruned bit reversal interleaving process.

10. A channel decoder configured to decode demodulated output symbols from a control channel comprising:
  a sequence derepetition block configured to remove repetition sequence from the demodulated output symbols;
  a deinterleaving block coupled to the sequence derepetition block, the deinterleaving block configured to deinterleave the output symbols;
  a tail-biting convolutional decoder coupled with the deinterleaving block, the tail-biting convolutional decoder configured to decode the output symbols and generate data bits;
  a first cyclical redundancy check (CRC) decoding block coupled to the tail-biting convolutional decoder, the first CRC decoding block configured to check the data bits;
  a scrambler block coupled between the first cyclical redundancy check (CRC) decoding block and the tail-biting convolutional decoder, wherein the scrambler block is configured to receive the output symbols from the modulator block, unscramble the output symbols, and send the unscrambled output symbols to the first cyclical redundancy check (CRC) decoding block; and
  a payload generating block coupled to the first CRC decoding block, the payload generating block configured to produce the payload data bits.

11. The channel decoder of claim 10, wherein the tail biting convolutional decoder is configured to decode the output symbols using Viterbi decoding and a circular trellis check.

12. The channel decoder of claim 10, wherein the payload generating block comprises a padding removal block coupled to the first cyclical redundancy check (CRC) decoding block, wherein the padding block is configured to remove the padding bits from the data bits.

13. The channel decoder of claim 10, wherein the payload generating block comprises:
  a header extraction block, wherein the header extraction block is configured to extract a header from the data bits; and
  a second cyclical redundancy check (CRC) decoding block coupled to the header extraction block, wherein the second CRC decoding block is configured to check CRC data bits.

14. The channel decoder of claim 10, wherein the data bits are Forward Share Control Channel (F-SCCH) bits or Reverse OFDM Dedicated Control Channel (R-ODCCH) bits.

15. A method for decoding demodulated output symbols on a control channel, comprising:
  removing a repetition sequence from the demodulated output symbols;
  deinterleaving the output symbols;
  decoding the output symbols using tail-biting convolutional decoding and generating data bits;
  performing a first cyclical redundancy check (CRC) on the data bits; and
  performing a second cyclical redundancy check (CRC) on the data bits after performing the first CRC on the data bits.

16. The method of claim 15, further comprising removing the padding bits from the data bits.

17. The method of claim 15, further comprising:
  extracting a block header type from the data bits, after performing a first cyclical redundancy check (CRC) on the data bits, and before performing the second cyclical redundancy check (CRC) on the data bits.

18. The method of claim 15, further comprising unscrambling the output symbols after decoding the output symbols using tail-biting convolutional decoding and before performing the first cyclical redundancy check (CRC).

19. The method of claim 15, wherein decoding the tail-biting convolutional encoding is performed using a Viterbi decoding and a circular trellis check.

* * * * *